(12) United States Patent
Sun et al.

(10) Patent No.: US 9,484,406 B1
(45) Date of Patent: Nov. 1, 2016

(54) METHOD FOR FABRICATING NANOWIRES FOR HORIZONTAL GATE ALL AROUND DEVICES FOR SEMICONDUCTOR APPLICATIONS

(71) Applicant: Applied Materials, Inc., Santa Clara, CA (US)

(72) Inventors: Shiyu Sun, Santa Clara, CA (US); Naomi Yoshida, Sunnyvale, CA (US); Bingxi Wood, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/874,146

(22) Filed: Oct. 2, 2015

Related U.S. Application Data

(60) Provisional application No. 62/213,969, filed on Sep. 3, 2015.

(51) Int. Cl.
    *H01L 29/423* (2006.01)
    *H01L 29/06* (2006.01)
    *H01L 21/02* (2006.01)
    *H01L 29/165* (2006.01)
    *H01L 29/41* (2006.01)

(52) U.S. Cl.
    CPC ....... *H01L 29/0673* (2013.01); *H01L 21/0206* (2013.01); *H01L 21/0214* (2013.01); *H01L 21/0228* (2013.01); *H01L 21/0231* (2013.01); *H01L 21/02126* (2013.01); *H01L 21/02167* (2013.01); *H01L 21/02233* (2013.01); *H01L 21/02236* (2013.01); *H01L 21/02252* (2013.01); *H01L 21/02532* (2013.01); *H01L 29/165* (2013.01); *H01L 29/413* (2013.01); *H01L 29/42392* (2013.01)

(58) Field of Classification Search
    CPC .................. H01L 21/02225; H01L 21/02227; H01L 21/70; H01L 21/702; H01L 21/71; H01L 27/11597; H01L 29/66007
    See application file for complete search history.

(56) References Cited

U.S. PATENT DOCUMENTS

2006/0187997 A1* 8/2006 Ezaki .................. H01S 5/18355
                                                    372/99

(Continued)

OTHER PUBLICATIONS

Bangsaruntip, S., et al., "High Performance and Highly Uniform Gate-All-Around Silicon NAnowire MOSFETs with Wire Size Dependent Scaling", IBM T.J. Watson Research Center, IEEE, 2009. (4 pgs).

(Continued)

*Primary Examiner* — Cheung Lee
(74) *Attorney, Agent, or Firm* — Patterson & Sheridan, LLP

(57) ABSTRACT

The present disclosure provide methods for forming nanowire structures with desired materials horizontal gate-all-around (hGAA) structures field effect transistor (FET) for semiconductor chips. In one example, a method of forming nanowire structures on a substrate includes supplying an oxygen containing gas mixture to a multi-material layer on a substrate in a processing chamber, wherein the multi-material layer includes repeating pairs of a first layer and a second layer, the first and the second layers having a first group and a second group of sidewalls respectively exposed through openings defined in the multi-material layer, and selectively forming an oxidation layer on the second group of sidewalls in the second layer.

18 Claims, 5 Drawing Sheets

(56) References Cited

U.S. PATENT DOCUMENTS

| | | | | |
|---|---|---|---|---|
| 2009/0233453 | A1* | 9/2009 | Mani | H01L 21/0223 438/772 |
| 2010/0075479 | A1* | 3/2010 | Kim | H01L 21/76224 438/424 |
| 2015/0145064 | A1* | 5/2015 | Ramachandran | H01L 29/785 257/401 |

OTHER PUBLICATIONS

Auth, C., et al., "A 22nm High Performance and Low-Power CMOS Technology Featuring Fully-Depleted Tri-Gate Transistors, Self-Aligned Contacts and High Density MIM Capacitors", 2012 Symposium on VLSI Technology Digest of Technical Papers, IEEE, 2012, pp. 131-132.

\* cited by examiner

METHOD FOR FABRICATING NANOWIRES FOR HORIZONTAL GATE ALL AROUND DEVICES FOR SEMICONDUCTOR APPLICATIONS

CROSS-REFERENCE TO RELATED APPLICATIONS

This application claims benefit of U.S. Provisional Application Ser. No. 62/213,969 filed Sep. 3, 2015, which is incorporated by reference in its entirety.

BACKGROUND

1. Field

Embodiments of the present invention generally relate to methods for forming vertically stacked nanowires with desired materials on a semiconductor substrate, and more particularly to methods for forming vertically stacked nanowires on a semiconductor substrate with desired materials for field effect transistor (FET) semiconductor manufacturing applications.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 25 nm and 20 nm dimensions and beyond, whereas the thickness of the dielectric layers remain substantially constant, with the result of increasing the aspect ratios of the features. Furthermore, reduced channel length often causes significant short channel effect with conventional planar MOSFET architecture. In order to enable fabrication of next generation devices and structures, three dimensional (3D) device structure is often utilized to improve performance of the transistors. In particular, fin field effect transistors (FinFET) are often utilized to enhance device performance. FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow. Device structures with hGAA configurations often provide superior electrostatic control by surrounding gate to suppress short channel effect and associated leakage current.

In some applications, horizontal gate-all-around (hGAA) structures are utilized for next generation semiconductor device applications. The hGAA device structure includes several lattice matched channels (e.g., nanowires) suspended in a stacked configuration and connected by source/drain regions.

In hGAA structures, different materials are often utilized to form the channel structures (e.g., nanowires), which may undesirably increase the manufacturing difficulty in integrating all these materials in the nanowire structures without deteriorating the device performance. For example, one of the challenges associated with hGAA structures include the existence of large parasitic capacitance between the metal gate and source/drain. Improper management of such parasitic capacitance may result in much degraded device performance.

Thus, there is a need for improved methods for forming channel structures for hGAA device structures on a substrate with good profile and dimension control.

SUMMARY

The present disclosure provides methods for forming nanowire structures with desired materials horizontal gate-all-around (hGAA) structures for semiconductor chips. In one example, a method of forming nanowire structures on a substrate includes supplying an oxygen containing gas mixture to a multi-material layer on a substrate in a processing chamber, wherein the multi-material layer includes repeating pairs of a first layer and a second layer, the first and the second layers having a first group and a second group of sidewalls respectively exposed through openings defined in the multi-material layer, and selectively forming an oxidation layer on the second group of sidewalls in the second layer.

In another example, a method of forming nanowire structures on a substrate includes predominantly forming an oxidation layer on a portion of a multi-material layer disposed on a substrate, wherein the multi-material layer includes repeating pairs of a first layer and a second layer, the first and second layers having a first group and a second group of sidewalls respectively exposed through openings defined in the multi-material layer, wherein the oxidation layer is selectively formed on the second group of the sidewalls in the second layer.

In yet another example, a method of forming nanowire structures on a substrate includes predominantly forming an oxidation layer on a portion of a multi-material layer disposed on a substrate, wherein the multi-material layer includes repeating pairs of a silicon layer and a SiGe layer, the silicon layer and the SiGe layer having a first group and a second group of sidewalls respectively exposed through openings defined in the multi-material layer, wherein the portion wherein the oxidation layer is selectively formed on is on the second group of the sidewalls in the SiGe layer.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4C depict cross sectional views of one example of a sequence for forming a nanowire structure with desired materials during the manufacturing process of FIG. 3.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for manufacturing nanowire structures with controlled parasitic capacitance for a horizontal gate-all-around (hGAA) semiconductor device structure are provided. In one example, a superlattice structure comprising different materials (e.g., a first material and a second material) arranged in an alternatingly stacked formation may be formed on a substrate to be later utilized as nanowires (e.g., channel structures) for horizontal gate-all-around (hGAA) semiconductor device structures. A selective oxidation process may be performed to selectively form an oxidation layer on sidewalls of the first material in the superlattice structure with minimum oxidation occurred on the second material. The oxidation selectivity on sidewalls of the first material to the second material in the superlattice structure is greater than 5:1. By doing so, the interface where the parasitic device is formed between the nanowires and the source/drain regions are maintained and controlled so as to efficiently reduce parasitic capacitance.

Figure 1:
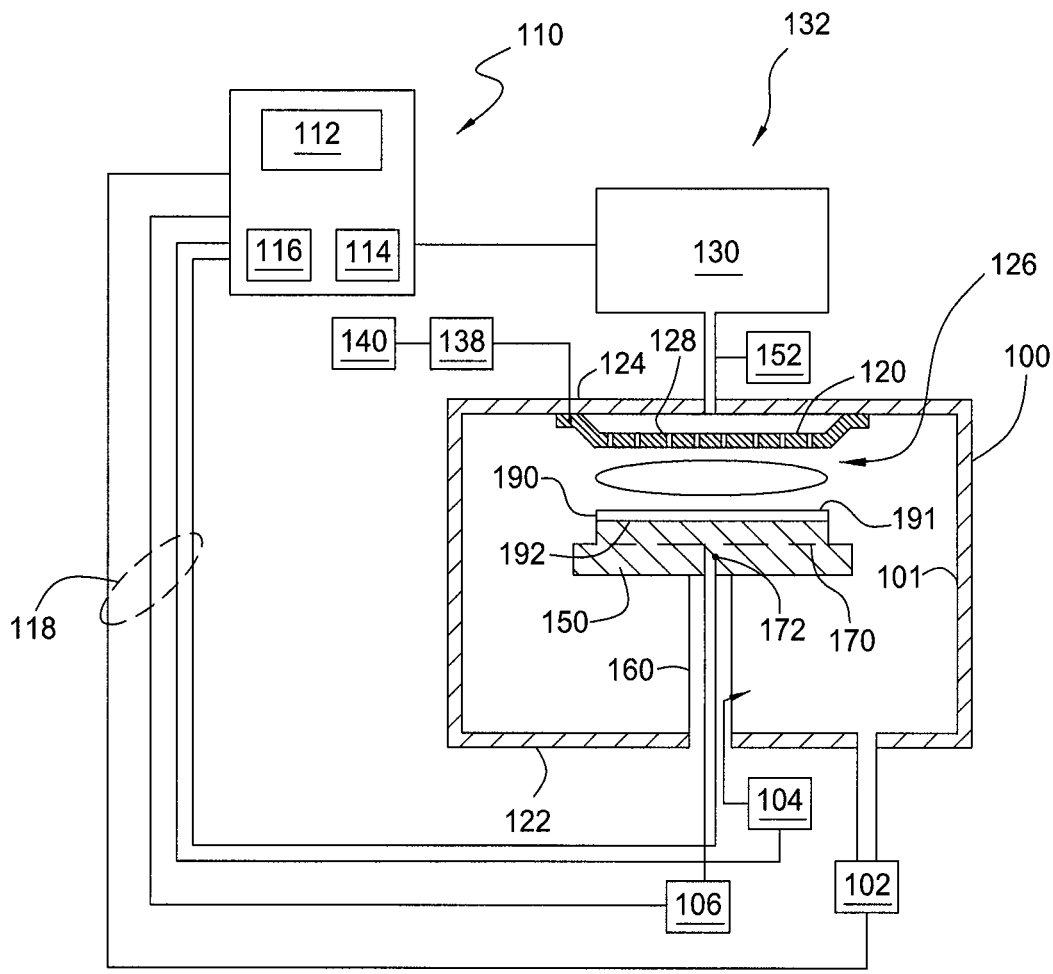
FIG. 1 depicts a plasma processing chamber which may be utilized to perform a deposition process on a substrate.

FIG. 1 is a cross sectional view of an illustrative processing system 132 suitable for performing a selective oxidation process as further described below. The processing system 132 may be a CENTURA®, and Producer® SE or Producer® GT deposition systems, all available from Applied Materials Inc., Santa Clara, Calif. It is contemplated that other processing system, including those available from other manufacturers, may be adapted to practice the invention.

The processing system 132 includes a processing chamber 100 coupled to a gas panel 130 and a controller 110. The processing chamber 100 generally includes a top 124, a side 101 and a bottom wall 122 that define an interior volume 126.

A support pedestal 150 is provided in the interior volume 126 of the chamber 100. The pedestal 150 may be fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber 100 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 1100 degrees Celsius, for example between 200 degree Celsius to about 1000 degrees Celsius, such as between about 300 degrees Celsius and about 800 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heater element 170 to maintain the substrate at a desired temperature.

A vacuum pump 102 is coupled to a port formed in the walls 101 of the chamber 100. The vacuum pump 102 is used to maintain a desired gas pressure in the processing chamber 100. The vacuum pump 102 also evacuates post-processing gases and by-products of the process from the chamber 100.

A showerhead 120 having a plurality of apertures 128 is coupled to the top 124 of the processing chamber 100 above the substrate support pedestal 150. The apertures 128 of the showerhead 120 are utilized to introduce process gases into the chamber 100. The apertures 128 may have different sizes, number, distributions, shape, design, and diameters to facilitate the flow of the various process gases for different process requirements. The showerhead 120 is connected to the gas panel 130 that allows various gases to supply to the interior volume 126 during process. A plasma is formed from the process gas mixture exiting the showerhead 120 to enhance thermal decomposition of the process gases resulting in the deposition of material on a surface 191 of the substrate 190.

The showerhead 120 and substrate support pedestal 150 may be formed a pair of spaced apart electrodes in the interior volume 126. One or more RF power sources 140 provide a bias potential through a matching network 138 to the showerhead 120 to facilitate generation of a plasma between the showerhead 120 and the pedestal 150. Alternatively, the RF power sources 140 and matching network 138 may be coupled to the showerhead 120, substrate support pedestal 150, or coupled to both the showerhead 120 and the substrate support pedestal 150, or coupled to an antenna (not shown) disposed exterior to the chamber 100. In one embodiment, the RF power sources 140 may provide between about 10 Watts and about 3000 Watts at a frequency of about 30 kHz to about 13.6 MHz.

An optional water vapor generating (WVG) system 152 is coupled to the processing system 132 that is in fluid communication to the interior volume 126 defined in the processing chamber 100. The WVG system 152 generates ultra-high purity water vapor by means of a catalytic reaction of $O_2$ and $H_2$. In one embodiment, the WVG system 152 has a catalyst-lined reactor or a catalyst cartridge in which water vapor is generated by means of a chemical reaction. The catalyst may include a metal or alloy, such as palladium, platinum, nickel, combinations thereof and alloys thereof.

The controller 110 includes a central processing unit (CPU) 112, a memory 116, and a support circuit 114 utilized to control the process sequence and regulate the gas flows from the gas panel 130 and the WVG system 152. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1.

Figure 2:
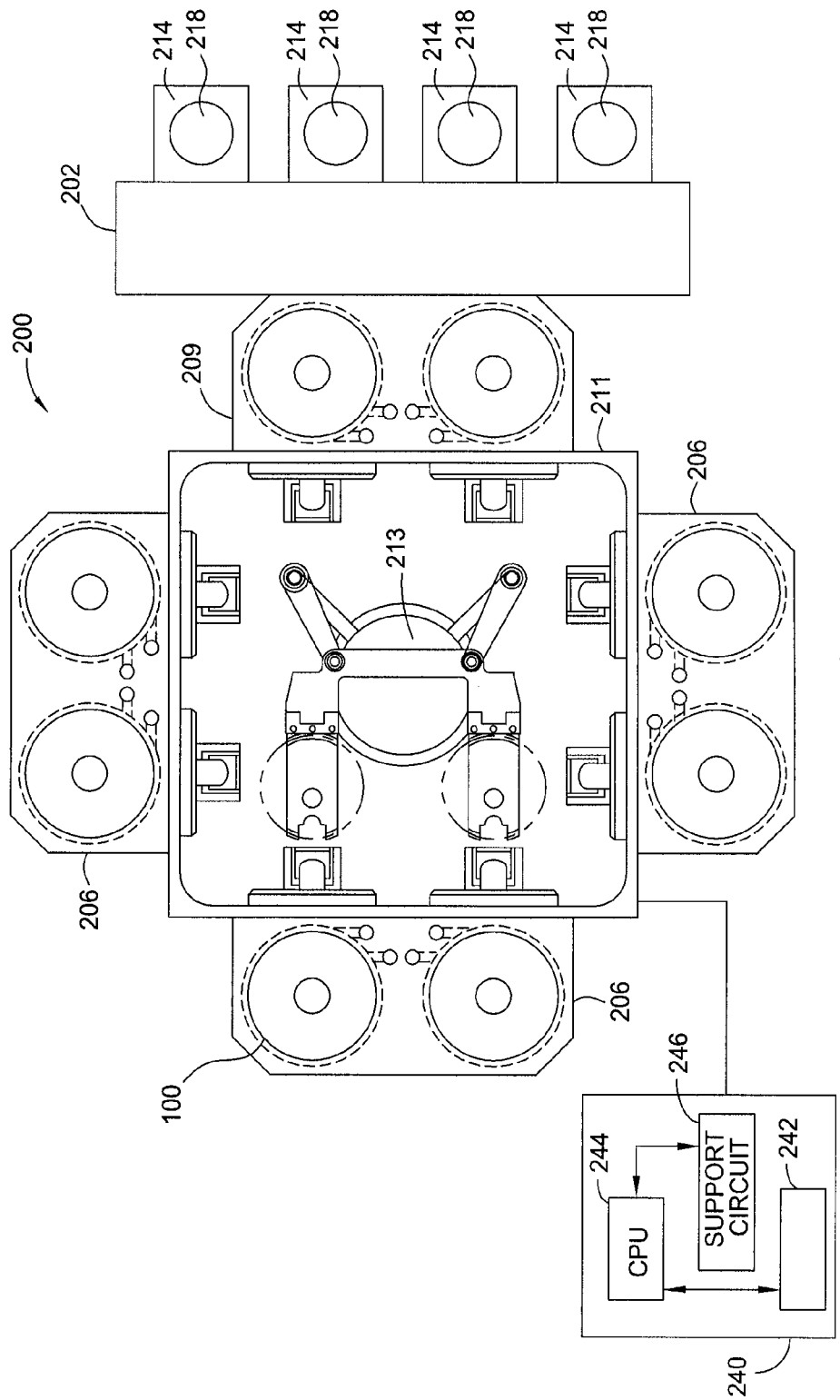
FIG. 2 depicts a processing system that may include plasma processing chambers of FIG. 1 to be incorporated therein.

FIG. 2 depicts a plan view of a semiconductor processing system 200 that the methods described herein may be practiced. One processing system that may be adapted to benefit from the invention is a 300 mm Producer™ processing system, commercially available from Applied Materials, Inc., of Santa Clara, Calif. The processing system 200 generally includes a front platform 202 where substrate cassettes 218 included in FOUPs 214 are supported and substrates are loaded into and unloaded from a loadlock chamber 209, a transfer chamber 211 housing a substrate handler 213 and a series of tandem processing chambers 206 mounted on the transfer chamber 211.

Each of the tandem processing chambers 206 includes two process regions for processing the substrates. The two process regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 206 can include a lid according to aspects of the invention as described below that includes one or more chamber configurations described above with referenced to the processing chamber 100 depicted in FIG. 1. It is noted that the processing chamber 100 may be configured to perform a deposition process, etching process, curing processes, or heating/annealing process as needed. In one embodiment, the processing chamber 100, shown as a single chamber designed, may be incorporated into the semiconductor processing system 200.

In one implementation, the processing system 132 can be adapted with one or more of the tandem processing chambers having supporting chamber hardware known to accommodate various other known processes such as chemical vapor deposition (CVD), physical vapor deposition (PVD), etching, curing, or heating/annealing and the like. For example, the system 200 can be configured with one of the processing chambers 100 as a plasma deposition chamber for deposition, such as a dielectric film, on the substrates. Such a configuration can maximize research and development fabrication utilization and, if desired, eliminate exposure of films as etched to atmosphere.

A controller 240, including a central processing unit (CPU) 244, a memory 242, and support circuits 246, is coupled to the various components of the semiconductor processing system 200 to facilitate control of the processes of the present invention. The memory 242 can be any computer-readable medium, such as random access memory (RAM), read only memory (ROM), floppy disk, hard disk, or any other form of digital storage, local or remote to the semiconductor processing system 200 or CPU 244. The support circuits 246 are coupled to the CPU 244 for supporting the CPU in a conventional manner. These circuits include cache, power supplies, clock circuits, input/output circuitry and subsystems, and the like. A software routine or a series of program instructions stored in the memory 242, when executed by the CPU 244, executes the tandem processing chambers 206.

Figure 3:
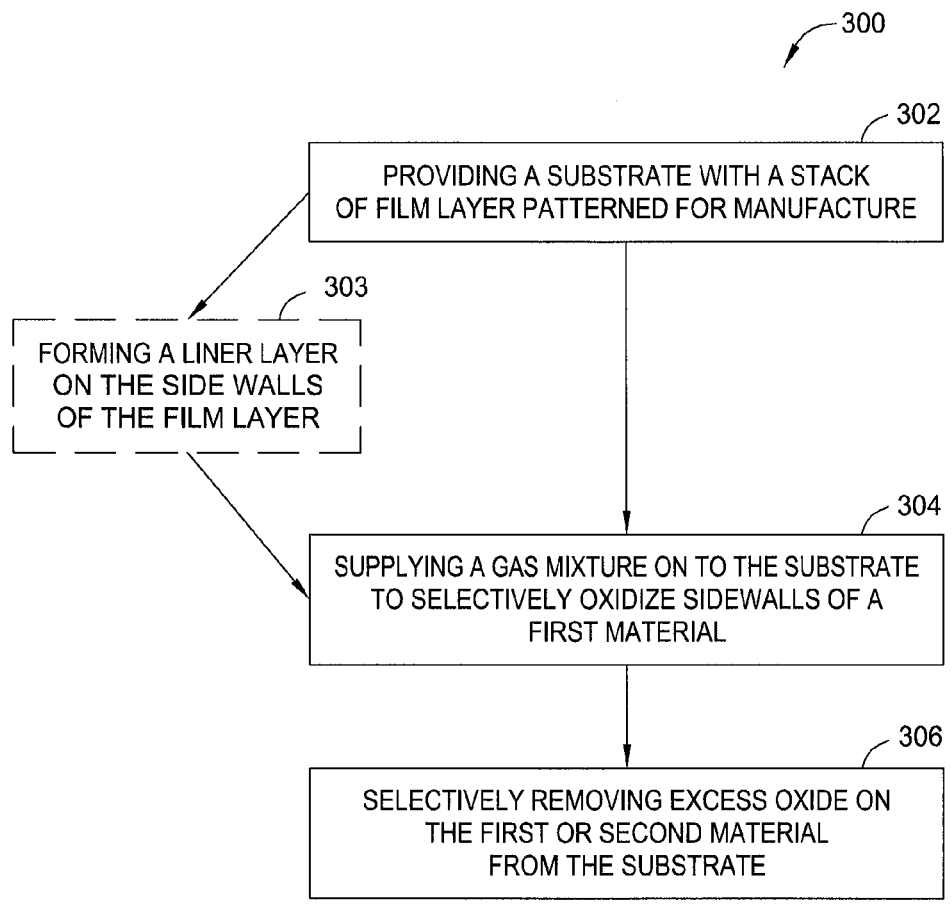
FIG. 3 depicts a flow diagram of a method for manufacturing nanowire structures formed on a substrate.
Figure 4A:
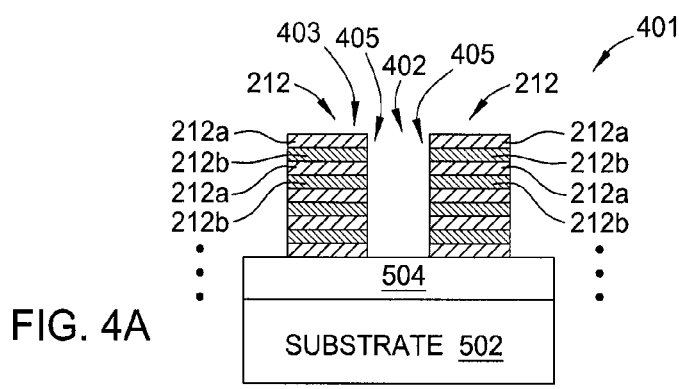
Figure 4C:
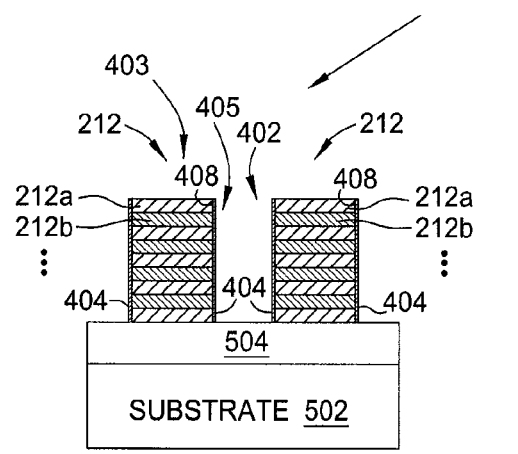
Figure 4C:
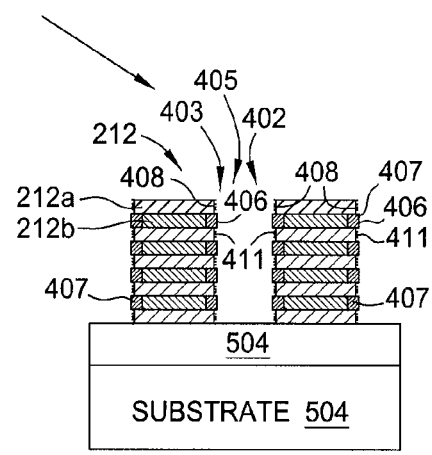
Figure 4C:
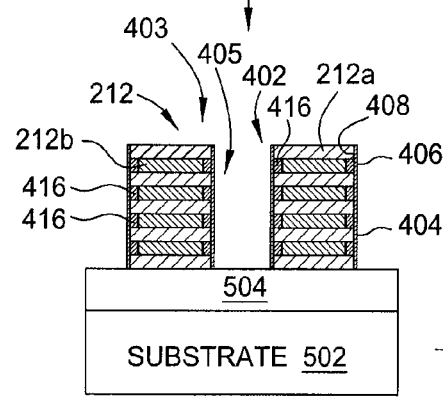
Figure 4C:
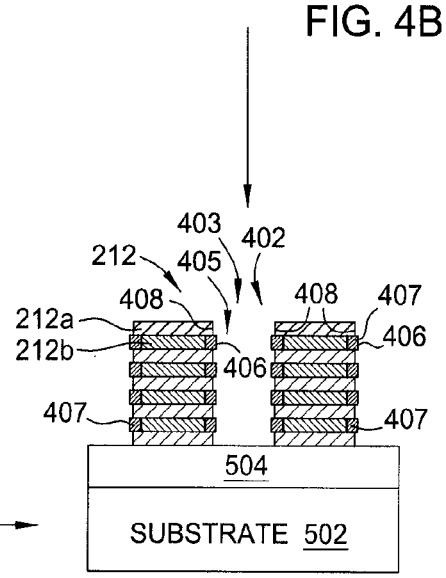

FIG. 3 is a flow diagram of one example of a method 300 for manufacturing nanowire structures (e.g., channel structures) with composite materials for horizontal gate-all-around (hGAA) semiconductor device structures. FIGS. 4A-4C are cross-sectional views of a portion of a composite substrate corresponding to various stages of the method 300. The method 300 may be utilized to form the nanowire structure for horizontal gate-all-around (hGAA) semiconductor device structures on a substrate having desired materials which may later be utilized to form a field effect transistor (FET). Alternatively, the method 300 may be beneficially utilized to manufacture other types of structures.

The method 300 begins at operation 302 by providing a substrate, such as the substrate 502 depicted in FIG. 2, having a film stack 401 formed thereon, as shown in FIG. 4A. The substrate 502 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 502 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The film stack 401 includes a multi-material layer 212 disposed on an optional material layer 504. In the embodiments wherein the optional material layer 504 is not present, the film stack 401 may be directly formed on the substrate 502 as needed. In one example, the optional material layer 504 is an insulating material. Suitable examples of the insulating material may include silicon oxide material, silicon nitride material, silicon oxynitride material, or any suitable insulating materials. Alternatively, the optional material layer 504 may be any suitable materials including conductive material or non-conductive material as needed. The multi-material layer 212 includes at least one pair of layers, each pair comprising a first layer 212a and a second layer 212b. Although the example depicted in FIG. 4A shows four pairs, each pair including the first layer 212a and the second layer 212b (alternating pairs, each pair comprising the first layer 212a and the second layer 212b), it is noted that number of pairs, each comprising a first layer 212a and a second layer 212b, may be varied based on different process needs. In one particular embodiment, 4 pairs of the first and second layers, 212a, 212b may be deposited to form the multi-material layer 212 on the substrate 502. In one implementation, the thickness of each single first layer 212a may be at between about 20 Å and about 200 Å, such as about 50 Å, and the thickness of the each single second layer 212b may be at between about 20 Å and about 200 Å, such as about 50 Å. The multi-material layer 212 may have a total thickness between about 10 Å and about 5000 Å, such as between about 40 Å and about 4000 Å.

The first layer 212a may be a crystalline silicon layer, such as a single crystalline, polycrystalline, or monocrystalline silicon layer, formed by an epitaxial deposition process. Alternatively, the first layer 212a may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the first layer 212a may be a group III-V material, such as a GaAs layer. The second layer 212b may be a Ge containing layer, such as a SiGe layer, Ge layer, or other suitable layer. Alternatively, the second layer 212b may be a doped silicon layer, including a p-type doped silicon layer or a n-type doped layer. In yet another example, the second layer 212b may be a group III-V material, such as a GaAs layer. In still another example, the first layer 212a may be a silicon layer and the second layer 212b is a metal material having a high-k material coating on outer surfaces of the metal material. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation the coating layer is a hafnium dioxide (HfO2) layer.

In the particular example depicted in FIG. 4A, the first layer 212a is a crystalline silicon layer, such as a single crystalline, polycrystalline, or monocrystalline silicon layer. The second layer 212b is a SiGe layer.

In some examples, a hardmask layer (not shown in FIG. 4A) and/or a patterned photoresist layer may be disposed on the multi-material layer 212 for patterning the multi-material layer 212. In the example shown in FIG. 4A, the multi-material layer 212 has been patterned in the previous patterning processes to form openings 402, which may later have source/drain anchors formed therein, in the multi-material layer 212.

In the implementation wherein the substrate 502 is a crystalline silicon layer and the insulating layer 504 is a silicon oxide layer, the first layer 212a may be intrinsic epi-silicon layer and the second layer 212b is a SiGe layer. In another implementation, the first layer 212a may be a doped silicon containing layer and the second layer 212b may be an intrinsic epi-silicon layer. The doped silicon containing layer may be a p-type dopant or a n-type dopant, or a SiGe layer as needed. In yet another implementation wherein the substrate 502 is a Ge or GaAs substrate, the first layer 212a may be a GeSi layer and the second layer 212b may be an intrinsic epi-Ge layer or vice versa. In still another implementation wherein the substrate 502 is a GaAs layer with dominantly a crystalline plane at <100>, the first layer 212a may be an intrinsic Ge layer and the second layer 212b is a GaAs layer or vise versa. It is noted that the selection of the substrate materials along with the first layer 212a and the second layer 212b in the multi-material layer 212 may be in different combinations utilizing the materials listed above.

At an optional operation 303, a liner layer 404 may be formed on sidewalls 405 of the multi-material layer 212, as shown in FIG. 4B2. The liner layer 404 may provide a substantially planar (e.g., even) surface that allows an oxidation layer to be later formed thereon with a good interface adhesion and planarity. The process for forming the oxidation layer will be described later at operation 304. Thus, in the embodiment wherein the sidewalls 405 of multi-material layer 212 is substantially planar with the desired straightness, the liner layer 404 may be eliminated and the oxide layer at operation 304 may be directly formed on the sidewalls 405 of the multi-material layer 212.

In one example, the liner layer 404 may be selected from a material that may assist bridging the oxidation layer to the sidewalls 405 of the multi-material layer 212 with good adhesion at the interface. Furthermore, the liner layer 404 may have a sufficient thickness to fill in the nanoscale rough surface from the sidewalls 405 of the multi-material layer 212 so as to provide a substantially planar surface that allows the oxidation layer later formed thereon with a desired level of planarity and flatness. In one example, the liner layer 404 may have a thickness between about 0.5 nm and about 5 nm.

In one embodiment, the liner layer 404 is a silicon containing dielectric layer, such as a silicon nitride containing layer, a silicon carbide containing layer, silicon oxygen containing layer, for example, SiN, SiON, SiC, SiCN, SiOC or silicon oxycarbonitride or silicon materials with dopants and the like. Dopants formed in the silicon containing dielectric layer may have relatively low concentration with silicon atoms rich film properties. In one example, the liner layer 404 is a silicon nitride layer or a silicon oxynitride (SiON) with a thickness between about 5 Å and about 50 Å, such as about 10 Å. The liner layer 404 may be formed by a CVD process, an ALD process or any suitable deposition techniques in a PVD, CVD, ALD, or other suitable plasma processing chambers.

At operation 304, after the optional liner layer 404 is formed on the sidewalls 405 of the multi-material layer 212, a selective oxide deposition may be performed to selectively form an oxidation layer selectively on certain regions of the multi-material layer 212. In the example wherein the optional operation 303 is not performed and the liner layer 404 is not formed on the substrate, the selective oxide deposition process may be performed directly on the substrate, as referenced in FIG. 4B1.

As the first layer 212a and the second layer 212b in the multi-material layer 212 are fabricated from different materials, when the selective oxide deposition process is performed, the oxidation process may predominately occur on one material relative to the other material. In the example depicted in FIG. 4B1 wherein the first layer 212a is a silicon layer and the second layer 212b is a SiGe layer, the selective oxidation process may predominately occur on sidewalls 406 of the second layer 212b, rather than on the first layer 212a. The selective oxidation process occurred on the sidewalls 406 of the second layer 212b forms an oxidation layer 407 predominately on the sidewalls 406 of the second layer 212b. It is believed that SiGe alloy has higher activity than silicon dominated materials. Thus, when oxygen atoms are supplied, the oxygen atoms tend to react with Si atoms in SiGe alloy with a faster reacting rate, rather than with Si atoms from silicon dominated materials, thus providing a selective deposition process to predominately form the oxidation layer 407 on the sidewalls 406 of the second layer 212b of SiGe alloy, rather than on the first layer 212a. Minimum oxide residuals 411 may be found on the sidewalls 408 of the first layer 212a.

The oxidation process consumes the silicon atoms from the SiGe alloy in the second layer 212b, pulling the silicon atoms outward to react with the oxygen atoms to form the oxidation layer 407. As the Ge atoms may be relatively easier to activate and move during the oxidation process, the silicon atoms in the second layer 212b are gradually being pulled out and react with the oxygen atoms to form the oxidation layer 407 on the sidewalls 406.

In contrast, as the silicon atoms in the first layer 212a does not have the Ge atoms to serve as an active driver to actively push the silicon atoms outwards to a position that allows reaction to react with oxygen atoms, the oxidation layer formation rate in the first layer 212a is significantly lower from the oxidation layer formation rate in the second layer 212b, thus providing a selective oxidation process that predominately forms the oxidation layer 407 on the sidewalls 406 of the second layer 212b rather than on the first layer 212a. In one example, the selectivity of the oxidation rate between the second layer 212b (e.g., a SiGe layer) and the first layer 212a (e.g., a silicon layer) is greater than 5:1, such as about 6:1 and 10:1.

In one implementation, the selective oxidation process may be performed in a suitable plasma processing chamber, including the processing chambers, such as the processing chamber 100 depicted in FIG. 1or other suitable plasma chamber. The processing temperature is controlled at a low temperature range, such as less than 1200 degrees Celsius. It is believed that the low temperature process may provide gentle thermal energy to consume the silicon atoms and pushing the silicon atoms toward the surface of the sidewalls where the oxygen atoms are present so as to form the silicon oxide 407 without damaging the lattice structures as formed from the Ge atoms in the film stack 401. By doing so, a portion of the silicon atoms may be gradually converted into the oxidation layer 407 without creating interfacial sites or atomic vacancies. In one implementation, the process temperature may be performed between about 100 degrees Celsius to about 1100 degrees Celsius, for example between 200 degree Celsius to about 1000 degrees Celsius, such as between about 300 degrees Celsius and about 800 degrees Celsius.

In one implementation, the oxidation process may be performed in a plasma containing environment (such as decoupled plasma oxidation or rapid thermal oxidation), a thermal environment (such as furnace) or thermal plasma environment (such as APCVD, SACVD, LPCVD, or any suitable CVD processes). The oxidation process may be performed by using an oxygen containing gas mixture in a processing environment to react the multi-material layer 212. In one implementation, the oxygen containing gas mixture includes at least one of an oxygen containing gas with or without an inert gas. Suitable examples of the oxygen containing gas include $O_2$, $O_3$, $H_2O$, $NO_2$, $N_2O$, steam vapor, moisture and the like. Suitable examples of the inert gas supplied with the treatment gas mixture include at least one of Ar, He, Kr, and the like. In an exemplary embodiment, the oxygen containing gas supplied in the oxygen containing gas mixture is $O_2$ gas with a flow rate between about 50 sccm and about 1000 sccm.

During the oxidation process, several process parameters may be regulated to control the oxidation process. In one exemplary implementation, a process pressure is regulated between about 0.1 Torr and about atmosphere (e.g., 760 Torr). In one example, the oxidation process as performed at operation 304 is configured to have a relatively high deposition pressure, such as a pressure greater than 100 Torr, such as between about 300 Torr and atmosphere. Suitable techniques that may be utilized to perform the selective oxidation process at operation 304 may include decoupled plasma oxide process (DPO), plasma enhanced chemical vapor deposition process (PECVD), low pressure chemical vapor deposition process (LPCVD), sub-atmospheric chemical vapor deposition process (SACVD), atmospheric chemical vapor deposition process (APCVD), thermal furnace process, oxygen annealing process, plasma immersion process, or any suitable process as needed. In one implementation, the oxidation process can be performed under ultra-violet (UV) light illumination.

In one implementation, the oxidation process is completed when a desired thickness of the oxidation layer 407 is formed on the sidewalls 406 of the second layer 212b. In one example, the oxidation layer 407 may have a thickness between about 1 nm and about 10 nm. The overall process time of the oxidation process may be determined by time mode after a desired portion the silicon atoms are predominantly reacted with the oxygen atoms to form the desired thickness of the oxidation layer 407. In one example, the substrate 502 is subjected to the selective oxidation process for between about 5 seconds to about 5 minutes, depending on the oxidation rate of the second layer 212b, pressure and flow rate of the gas. In an exemplary implementation, the substrate 502 is exposed to the oxidation processes for about 600 seconds or less.

Furthermore, in the examples wherein the liner layer 404 is formed on the sidewalls 405 of the multi-material layer 212, when the selective oxidation process is performed at operation 304, similarly, the oxidation layer 416 may only be selectively formed on the sidewalls 406 of the second layer 212b with where the liner layer 404 contacts, as shown in FIG. 4B2'. As discussed above, the GeSi alloy in the second layer 212b is more active than the Si material present in the first layer 212a. During the oxidation process, the Ge atoms may be activated by the thermal energy from the oxidation process, creating interfacial vacancies that allow the oxygen atoms to be pulled in to form bonding with the silicon atoms. The oxygen atoms from the selective oxidation process thus penetrate through the liner layer 404 to react with the silicon atoms from the second layer 212b, forming the oxidation layer 416 on the sidewalls 406 of the second layer 212b. As the liner layer 404 provides a substantially planar surface on the sidewalls 405 of the multi-material layer 212, the oxidation layer 416 formed in the second layer 212b under the liner layer 404 may still maintain a substantially planar surface on the sidewalls 405 so as to provide a straight sidewall profile as desired for the nanowire structures. In one embodiment, the liner layer 404 in combination with the oxidation layer 416 may have a thickness between about 3 nm an about 15 nm, such as between about 7 nm and about 8 nm.

After the oxidation layer 416, 407 is formed in the film stack 401, the multi-material layer 212 of the first layer 212a and the second layer 212b with the oxidation layer 416, 407 formed to its bottom may be utilized as nanowires 403 in a field effect transistor (FET) with reduced parasitic capacitance and minimum device leakage.

At operation 306, a gentle surface clean process is performed to selectively remove the oxide residuals 411, if any, from the film stack 401 without damaging the surfaces of the film stack 401, as shown in FIG. 4C. The oxide residuals 411 may be removed by dry etching process or wet etching process as needed.

Figure 5A:
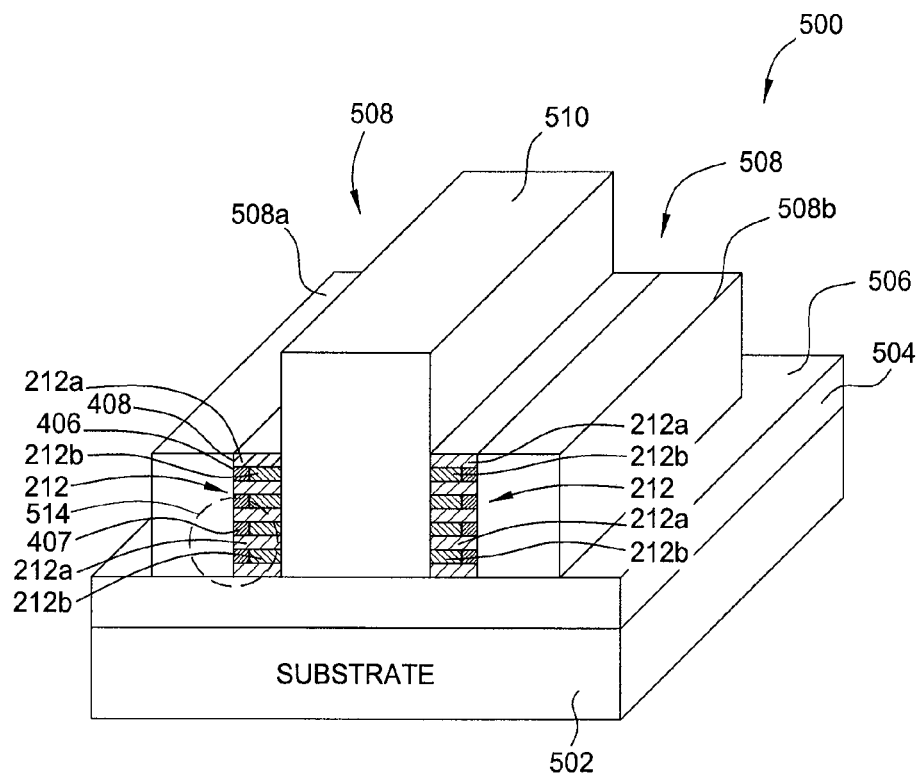
FIGS. 5A-5B depict a schematic view of an example of a horizontal gate-all-around (hGAA) structure.
Figure 5B:
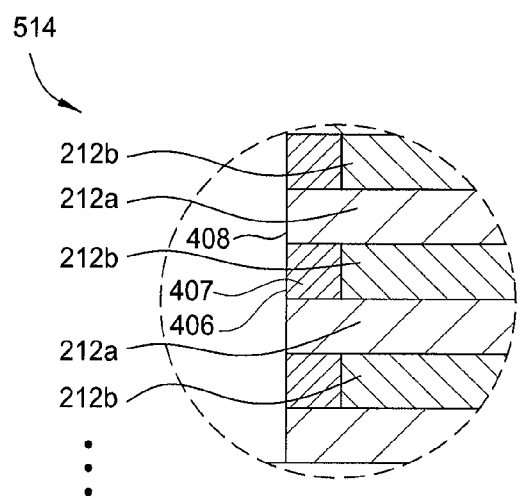

FIG. 5A depicts a schematic view of the multi-material layer 212 having pairs of the first layer 212a and the second layer 212b with the oxidation layer 407 formed therein utilized in a horizontal gate-all-around (hGAA) structure 500. The horizontal gate-all-around (hGAA) structure 500 utilizes the multi-material layer 212 as nanowires (e.g., channels) between source/drain anchors 508 (also shown as 508a, 508b for source and drain anchors, respectively) and a gate structure 510. As shown in the enlarged view of the multi-material layer 212 in FIG. 5B indicated by the circle 514, the oxidation layer 407 (or oxidation layer 416 as shown previously in FIG. 4B2') formed at the bottom (e.g., or an end) of the second layer 212b may assist managing the interface wherein the second layer 212b is in contact with the gate structure 510 and/or the source/drain anchors 508a, 508b so as to reduce parasitic capacitance and maintain minimum device leakage.

Thus, methods for forming nanowire structures with reduced parasitic capacitance and minimum device leakage for horizontal gate-all-around (hGAA) structures are provided. The methods utilize selective oxidation process to selectively form an oxidation layer on certain types of material from a multi-material layer so as to form nanowire structures with reduced parasitic capacitance and minimum device leakage at the interface that may be later utilized to form horizontal gate-all-around (hGAA) structures. Thus, horizontal gate-all-around (hGAA) structures with desired type of material and device electrical performance may be obtained, particularly for applications in horizontal gate-all-around field effect transistors (hGAA FET).

While the foregoing is directed to embodiments of the present invention, other and further embodiments of the invention may be devised without departing from the basic scope thereof, and the scope thereof is determined by the claims that follow.

The invention claimed is:

1. A method of forming nanowire structures on a substrate comprising:
supplying an oxygen containing gas mixture to a multi-material layer on a substrate in a processing chamber, wherein the multi-material layer includes repeating pairs of a first layer and a second layer, the first and the second layers having a first group and a second group of sidewalls respectively exposed through openings defined in the multi-material layer;
selectively forming an oxidation layer on the second group of sidewalls in the second layer; and
forming horizontal gate-all-around (hGAA) structures using the openings defined in the multi-material layer.

2. The method of claim 1, wherein supplying the oxygen containing gas mixture further comprises:
forming a liner layer on the first group and the second group of sidewalls of the first and second layers prior to supplying the oxygen containing gas to the substrate.

3. The method of claim 2, wherein the liner layer is silicon nitride, silicon oxynitride, silicon oxycarbide, silicon carbonitride or silicon oxycarbonitride or silicon materials with dopants.

4. The method of claim 2, wherein the liner layer is fabricated by an ALD process.

5. The method of claim 2, wherein the liner layer has a thickness between about 0.5 nm and about 5 nm.

6. The method of claim 2, wherein the liner layer has a substantially planar surface that is substantially parallel with the oxidation layer.

7. The method of claim 1, wherein oxygen containing gas mixture includes at least an oxygen containing gas selected from a group consisting of $O_2$, $O_3$, $H_2O$, $NO_2$, $N_2O$, steam vapor or moisture.

8. The method of claim 1, wherein the first layer of the multi-material layer is an intrinsic silicon layer and the second layer of the multi-material layer is a SiGe layer while the substrate is a silicon substrate.

9. The method of claim 1, wherein supplying the oxygen containing gas mixture further comprises:
performing a decoupled plasma process to form the oxidation layer on the second group of sidewalls in the second layer.

10. The method of claim 1 further comprising:
performing a cleaning process to remove oxide residuals from the substrate.

11. The method of claim 1, wherein the multi-material layer includes at least 4 repeating pairs.

12. The method of claim 1, wherein the oxidation layer has thickness between about 1 nm and about 10 nm.

13. The method of claim 1, wherein supplying the oxygen containing gas mixture further comprises:
maintaining a substrate temperature between about 200 degrees Celsius and about 1000 degrees Celsius.

14. The method of claim 1, wherein selectively forming the oxidation layer by a ultra-violet (UV) light illumination process.

15. A method of forming nanowire structures on a substrate comprising:
predominantly forming an oxidation layer on a portion of a multi-material layer disposed on a substrate, wherein the multi-material layer includes repeating pairs of a first layer and a second layer, the first and second layers having a first group and a second group of sidewalls respectively exposed through openings defined in the multi-material layer, wherein the oxidation layer is selectively formed on the second group of the sidewalls in the second layer, wherein the multi-material layer is utilized to form nanowires or channels in horizontal gate-all-around (hGAA) structures.

16. The method of claim 15, wherein the first layer of the multi-material layer is an intrinsic silicon layer and the second layer of the multi-material layer is a SiGe layer while the substrate is a silicon substrate.

17. The method of claim 15, further comprising:
forming a liner layer on the first and the second groups of the sidewalls of the first and second layers prior to forming the oxidation layer.

18. A method of forming nanowire structures on a substrate comprising:
predominantly forming an oxidation layer on a portion of a multi-material layer disposed on a substrate, wherein the multi-material layer includes repeating pairs of a silicon layer and a SiGe layer, the silicon layer and the SiGe layer having a first group and a second group of sidewalls respectively exposed through openings defined in the multi-material layer, wherein the portion wherein the oxidation layer is selectively formed on is on the second group of the sidewalls in the SiGe layer.

* * * * *